(12) United States Patent
Chen et al.

(10) Patent No.: US 7,242,050 B2
(45) Date of Patent: Jul. 10, 2007

(54) STACKED GATE MEMORY CELL WITH ERASE TO GATE, ARRAY, AND METHOD OF MANUFACTURING

(75) Inventors: Bomy Chen, Cupertino, CA (US); Hieu Van Tran, San Jose, CA (US); Dana Lee, Santa Clara, CA (US); Jack Edward Frayer, Boulder Creek, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 187 days.

(21) Appl. No.: 10/714,243

(22) Filed: Nov. 13, 2003

(65) Prior Publication Data

US 2005/0104116 A1    May 19, 2005

(51) Int. Cl.
*H01L 29/788* (2006.01)
(52) U.S. Cl. .............. 257/315; 257/317; 257/E21.676; 257/E27.054
(58) Field of Classification Search ............... 257/315; 438/238
See application file for complete search history.

(56) References Cited

U.S. PATENT DOCUMENTS

| | | | |
|---|---|---|---|
| 5,021,999 A | 6/1991 | Kohda et al. | |
| 5,029,130 A | 7/1991 | Yeh | |
| 5,616,510 A * | 4/1997 | Wong | 438/259 |
| 5,739,567 A | 4/1998 | Wong | |
| 5,768,192 A | 6/1998 | Eitan | |
| 6,002,152 A | 12/1999 | Guterman et al. | |
| 6,011,725 A | 1/2000 | Eitan | |
| 6,040,210 A * | 3/2000 | Burns et al. | 438/238 |
| 6,093,945 A | 7/2000 | Yang | |
| 6,103,573 A | 8/2000 | Harari et al. | |
| 6,151,248 A * | 11/2000 | Harari et al. | 365/185.14 |
| 6,281,545 B1 | 8/2001 | Liang et al. | |
| 6,316,315 B1 * | 11/2001 | Hofmann et al. | 438/259 |
| 6,329,685 B1 | 12/2001 | Lee | |
| 6,420,231 B1 | 7/2002 | Harari et al. | |
| 6,426,896 B1 | 7/2002 | Chen | |
| 6,444,525 B1 * | 9/2002 | Lee | 438/259 |
| 6,541,815 B1 * | 4/2003 | Mandelman et al. | 257/315 |
| 6,597,036 B1 | 7/2003 | Lee et al. | |
| 6,952,034 B2 * | 10/2005 | Hu et al. | 257/315 |
| 2002/0056870 A1 | 5/2002 | Lee et al. | |
| 2002/0163031 A1 | 11/2002 | Lee et al. | |
| 2004/0087084 A1 | 5/2004 | Hsieh | |

OTHER PUBLICATIONS

Hayashi et al., "A Self-Aligned Split-Gate Flash EEPROM Cell With 3-D Pillar Structure," pp. 87-88, 1999 Symposium on VLSI Technology Digest Of Technical Papers, Center for Integrated Systems, Stanford University, Stanford, CA 94305, USA.

IEEE, 2002, entitled "Quantum-well Memory Device (QW/MD) With Extremely Good Charge Retention," Z. Krivokapic, et al. (4 pages).

* cited by examiner

*Primary Examiner*—Andy Huynh
*Assistant Examiner*—Dao H. Nguyen
(74) *Attorney, Agent, or Firm*—DLA Piper US LLP

(57) ABSTRACT

A stacked gate nonvolatile memory floating gate device has a control gate. Programming of the cell in the array is accomplished by hot channel electron injection from the drain to the floating gate. Erasure occurs by Fowler-Nordheim tunneling of electrons from the floating gate to the control gate. Finally, to increase the density, each cell can be made in a trench.

14 Claims, 5 Drawing Sheets

STACKED GATE MEMORY CELL WITH ERASE TO GATE, ARRAY, AND METHOD OF MANUFACTURING

TECHNICAL FIELD

The present invention relates to a stacked gate nonvolatile memory cell having an erase to gate mechanism, an array thereof, and a method of manufacturing the cell and the array.

BACKGROUND OF THE INVENTION

Nonvolatile memory cells using floating gate as the storage device are well known in the art. Nonvolatile memory cells using a floating gate for storage can be stacked gate type or split gate type. In a stacked gate cell, the cell has a first region and a second region spaced apart from one another in a semiconductor substrate with a channel region therebetween. A floating gate is spaced apart and insulated from the entire channel region, and controls the conduction of current in the channel region. A control gate is capacitively coupled and is spaced apart and insulated from the floating gate. The control gate is "stacked" on top of the floating gate—hence the term "stacked gate nonvolatile memory cell."

In a stacked gate nonvolatile memory cell, programming occurs by either electrons being Fowler-Nordheim tunneled from the first region or the second region onto the floating gate or injected onto the floating gate through the mechanism of hot channel electron injection. The erase mechanism is for the electrons from the floating gate tunnel through an insulating layer either to the substrate, or to the first or second region.

In a split gate type nonvolatile memory cell, the floating gate is spaced apart and insulated from only a portion of the channel region. The control gate is over another portion of the channel region. Collectively, the operation of both the floating gate and the control gate is required to control the flow of current in the channel region. U.S. Pat. No. 5,029,130 discloses a split gate nonvolatile memory cell in which erasing occurs through the action of electrons from the floating gate being tunneled to an insulating layer to the control gate. The disclosure of U.S. Pat. No. 5,029,130 is hereby incorporated in its entirety by reference.

It is one of the objects of the present invention to improve upon the stacked gate nonvolatile memory cell of the prior art.

SUMMARY OF THE INVENTION

A nonvolatile memory cell has a substantially single crystalline substrate of a first conductivity type with a planar surface. A trench is in the planar surface with the trench having a sidewall and a bottom. A floating gate is in the trench spaced apart and insulated from the sidewall and from the bottom. The floating gate has two ends: a first end near the bottom and a second end away from the bottom. The floating gate has a tip near the second end. A first region of a second conductivity type is in the bottom of the trench. A second region of the second conductivity type is along the planar surface spaced apart from the first region. A channel region lies between the first region and the second region and is along the sidewall of the trench. A control gate is capacitively coupled to the floating gate at the tip. Erase occurs between the control gate and the floating gate through the tip. A tunnel material is between the tip and the control gate.

The present invention also relates to an array of the foregoing described memory cells, a NAND device having a control gate capable of effecting erase, a method of operating a stacked gate nonvolatile memory cell, and a method of manufacturing an array of stacked gate nonvolatile memory cells.

DETAILED DESCRIPTION OF THE INVENTION

Figure 1A:
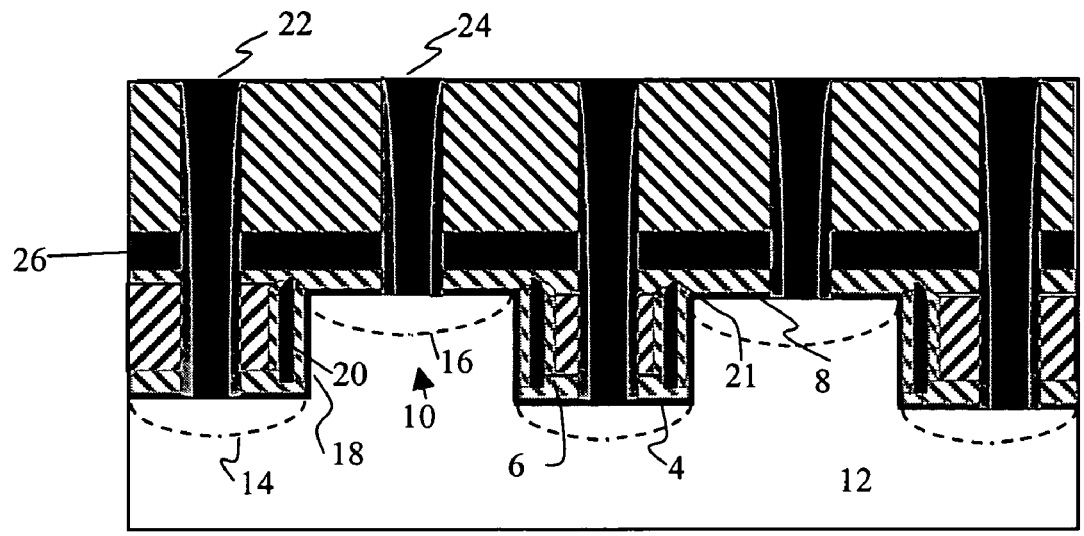
FIG. 1A is a cross-sectional view of a stacked gate nonvolatile memory cell of the present invention.

Referring to FIG. 1A, there is shown a cross-sectional view of a stacked gate nonvolatile memory cell 10 of the present invention. The cell 10 comprises a substantially single crystalline semiconductive material such as single crystalline silicon 12 of a first conductivity type, such as P-type. The substrate 12 has a planar surface 8. As shown in FIG. 1A, a plurality of trenches 6 are "cut" into the planar surface 8. Each of the trenches 6 has a bottom surface 4 and a sidewall 18. The cell 10 comprises a first region 14 of a second conductivity type, such as N, along the bottom surface 4 of the trench 6. The cell 10 also comprises a second region 16 of a second conductivity type, such as N, spaced apart from the first region 14. The second region 16 is along the planar surface 8 of the substrate 12. A channel region is along the sidewall 18 of the trench 6 and separates the first region 14 from the second region 16.

Figure 1B:
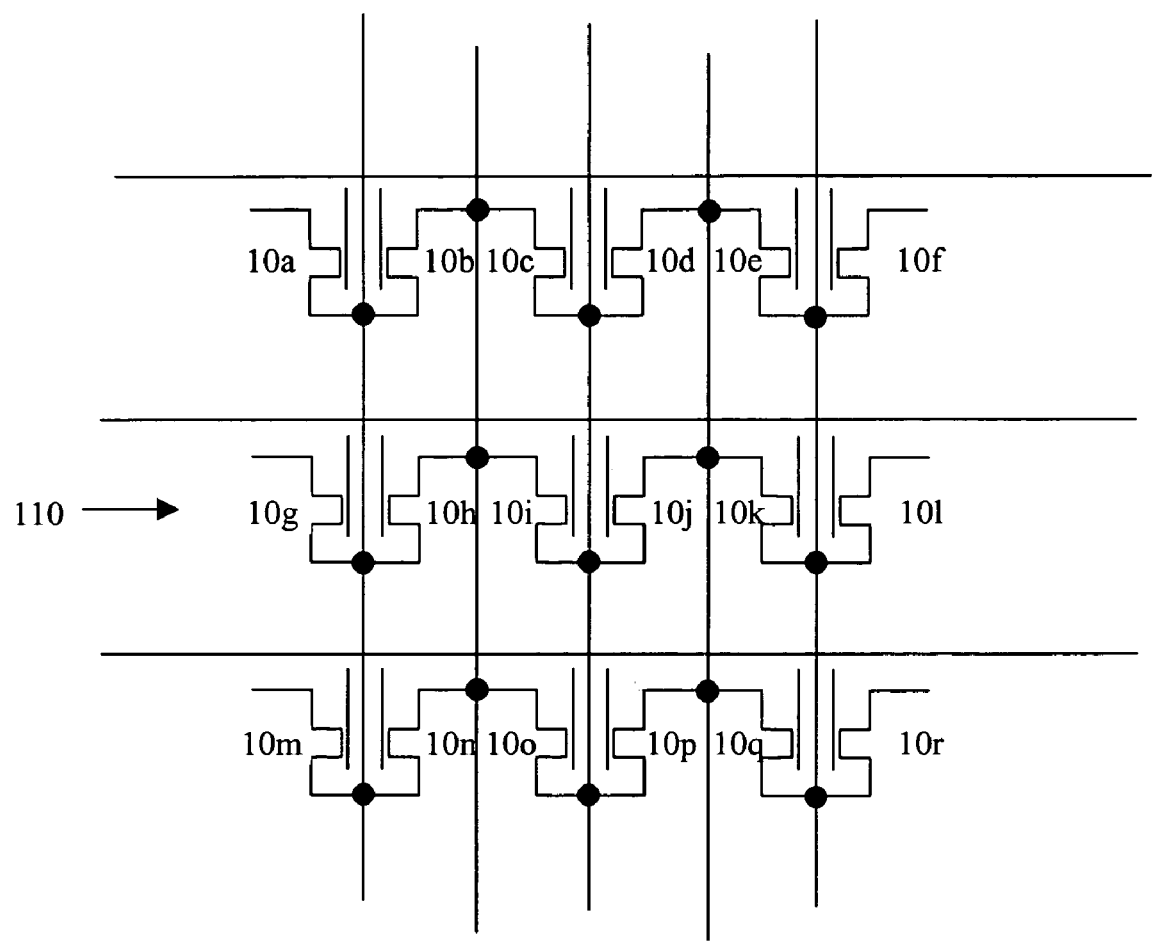
FIG. 1B is a schematic circuit diagram of an array of stacked gate nonvolatile memory cells, each of which is of the type whose cross-sectional view is shown in FIG. 1A.

A floating gate 20 is in the trench 6 and is spaced apart and insulated from the sidewall 18 and the bottom 4 of the trench 6. The floating gate 20 is made out of doped polysilicon. The floating gate 20 has two ends with a first end close to the bottom 4 of the trench 6 and a second end away from the bottom 4. The floating gate 20 has a tip 21 near the second end and is away from the bottom 4 of the trench 6. A control gate 26, made out of doped polysilicon or any other silicide or metallized silicide material is insulated and spaced apart from the tip 21 of the floating gate 20, with a layer of tunneling material between the control gate 26 and the tip 21. A first contact 22 is in the trench 6 and makes electrical contact with the first region 14. The first contact 22 can be made out of polysilicon, metal or any metallized silicide. The first contact 22 is also substantially parallel to the floating gate 20 and is capacitively coupled thereto. A second contact 24 makes electrical contact with the second region 16. Again, the second contact 24 can be made out of metal, polysilicon or any metallized silicide. It should be noted that when an array 110 (as shown in FIG. 1b) of the cells 10 is formed in a silicon substrate 12, the first contact 22, and the second contact 24 need not make contact with the first and second regions 14 and 16, respectively of each cell 10. The contacts 22 and 24 merely provide electrical strapping to the first and second regions 14 and 16, respectively, and therefore are not required for each cell 10.

In the operation of the memory cell 10, to program, a high voltage, such as +6volts, is supplied to the first region 14. This can be done by applying the voltage to the first contact 22. A low voltage, such as ground, is supplied to the second contact 24 which is supplied to the second region 16. A coupling voltage, such as +5.0 volts is applied to the control gate 26. Because the floating gate 20 is capacitively coupled to the first contact 22 and to the control gate 26, the floating gate 20 will experience a positive voltage. This then turns on the channel region in the sidewall 18. Electrons from the second region 16 are then accelerated to the first region 14 in the channel region which is along the sidewall 18. They are then attracted by the high voltage experienced by the floating gate 20 and are injected onto the floating gate 20 by the mechanism of hot channel electron injection to program the floating gate 20. As previously discussed, when the cell 10 is formed in an array 110, the first contact 22 is not connected to the first region 14 in the trench 6 of each cell 10. Thus, in those cells 10 where there is no first contact 22 made to the first region 14 in the trench 6, the voltage +5.0 volts on the control gate 26 is capacitively coupled to the floating gate 20, to turn on the channel region 18.

To read the cell, a moderate voltage, such as 1.0 volts is supplied to the second contact 24, which is supplied to the second region 16. A ground voltage is supplied to the first contact 22 which is supplied to the first region 14. A reading voltage of approximately +3.0 volts is supplied to the control gate 26. If the floating gate 20 were not programmed, i.e., it does not have electrons stored thereon, the +3.0 volt on the control gate 26 capacitively couples the floating gate 20 to be slightly positive which turns on the channel region between the first region 14 and the second region 16. Electrons from the first region 14 are attracted and pass through the channel region 18 to the second region 16. The current is detected at the second contact 24. In the event the floating gate 20 were programmed, the negative charges on the floating gate 20 is sufficient to overcome the voltage coupled from the control gate 26, thereby turning off the channel region 18 between the first region 14 and the second region 16. In that event, no current would flow between the first region 14 and the second region 16.

Finally, to erase the floating gate 20, a ground voltage is applied to the first contact 22. The ground voltage is capacitively coupled to the floating gate 20. A relatively high erase voltage such as +12 volts is supplied to the control gate 26. Electrons from the floating gate 20 are attracted to the high positive voltage on the control gate 26 and through the mechanism of Fowler-Nordheim tunneling, they tunnel from the tip 21 of the floating gate 20 through the insulating material separating the tip 21 from the control gate 26, to the control gate 26. The mechanism of poly-to-poly erasure through Fowler-Nordheim tunneling is disclosed in U.S. Pat. No. 5,029,130 whose disclosure is incorporated herein by reference in its entirety.

Referring to FIG. 1B, there is shown an array 110 of the nonvolatile stacked gate flash memory cells 10 shown in FIG. 1A. As is well known in the art, a plurality of memory cells 10 are arranged in a plurality of rows and columns. It should be recognized that the term "row" and "column" are interchangeable. Thus, a first row of memory cells comprises memory cells 10(A-F), a second row of memory cells 10 comprises memory cells 10(G-L), while a third row of memory cells 10 comprises memory cells 10(M-R). Memory cells 10A, 10G and 10M are aligned in the same column. Similarly, memory cells 10B, 10H and 10N are arranged in the same column. Within each row of memory cells 10, each memory cell 10 shares its first region 14 with an adjacent memory cell 10 to one side and its second region 16 with an adjacent memory cell 10 on the other side. Thus, memory cell 10B shares its first region 14 in common with memory cell 10A and shares its second region 16 in common with memory cell 10C. Region 14 and region 16 in the same column are connected together and form continuous columns. As previously discussed, the contacts 22 and 24 are made only periodically to regions 14 and 16, respectively, of certain cells 10. Finally, within each row, a control gate 26 is in common to all of the memory cells 10 in that row. Because in a flash memory device, typically a plurality of rows of memory cells are erased in common, the control gate 26 of one row may be connected in common with a control gate 26 of an adjacent row.

In accordance with the foregoing discussion with regard to the programming, reading and erasure of a memory cell 10, the operation of the memory array 110 is as follows:

|  | Selected Col. Contact 22 | Unselected Col. Contact 22 | Selected Col. Contact 24 | Unselected Col. Contact 24 | Selected Row Control Gate 26 | Unselected Row Control Gate 26 |
|---|---|---|---|---|---|---|
| Program | 6.0 v. | 0.0 v | 0.0 v | 2.0 v | 5.0 v | 0.0 v |
| Read | 1.0 v | 0.0 v | 0.0 v | 1.0 v | 3.0 v | 0.0 v |
| Erase | 0.0 v | float | float | float | 12.0 v | 0.0 v |

Figure 2A:
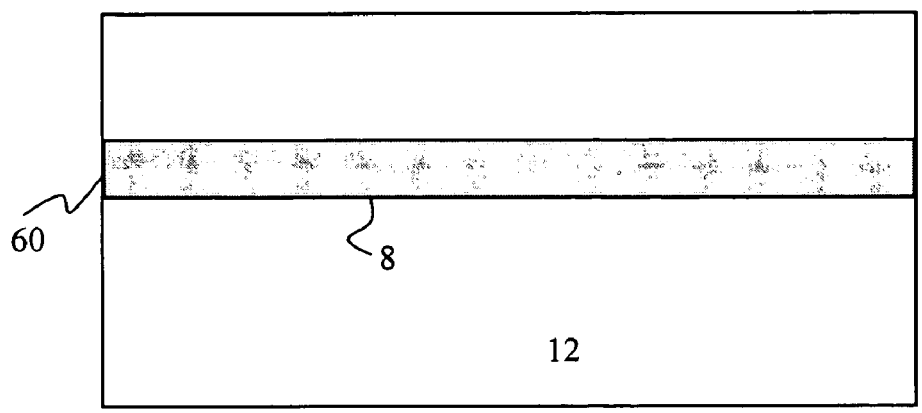
FIGS. 2A-2K are cross-sectional views of a process for making an array of stacked gate nonvolatile memory cells of the present invention.

Referring to FIG. 2A there is shown a first step in a method of the present invention to make the memory array 110 and the memory cell 10 of the present invention. The method begins with a single crystalline semiconductive substrate 12 of a P conductivity type. A layer of silicon dioxide 60 is formed covering the planar surface 8. The resultant structure is shown in FIG. 2A.

Figure 2B:
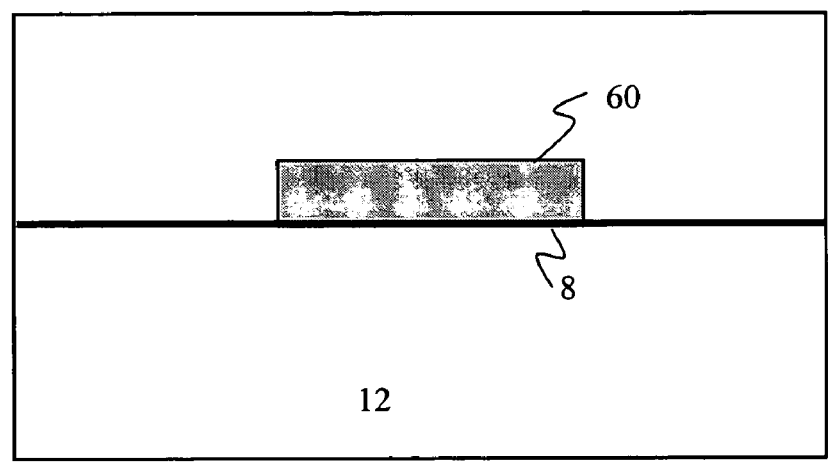
Figure 2C:
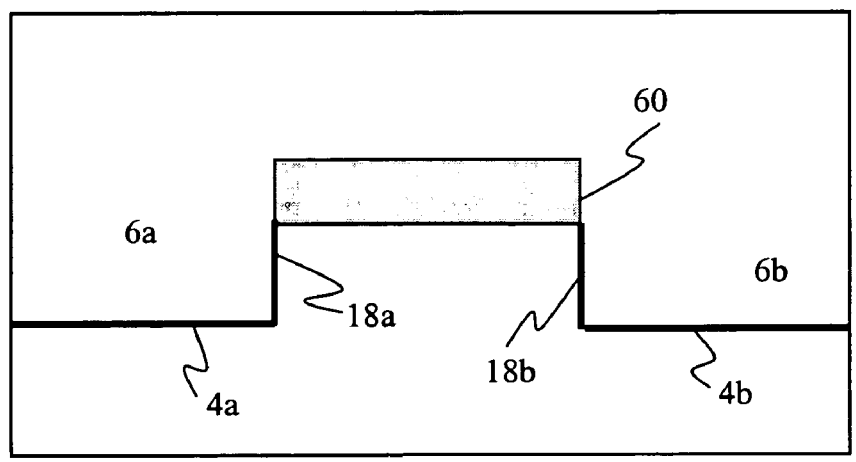

The silicon dioxide layer 60 is masked by a photolithography process and the silicon dioxide layer 60 is then cut. The resultant structure is shown in FIG. 2B.

Where the planar surface 8 of the substrate 12 is exposed and is not covered by the silicon dioxide 60, the substrate 12 is anisotropically etched creating a plurality of spaced apart trenches 6. The resultant structure is shown in FIG. 2C. Each trench is characterized by having a sidewall 18 and a bottom surface 4.

The silicon dioxide layer 60 is then removed. The resultant structure is shown in FIG. 2D.

Figure 2D:
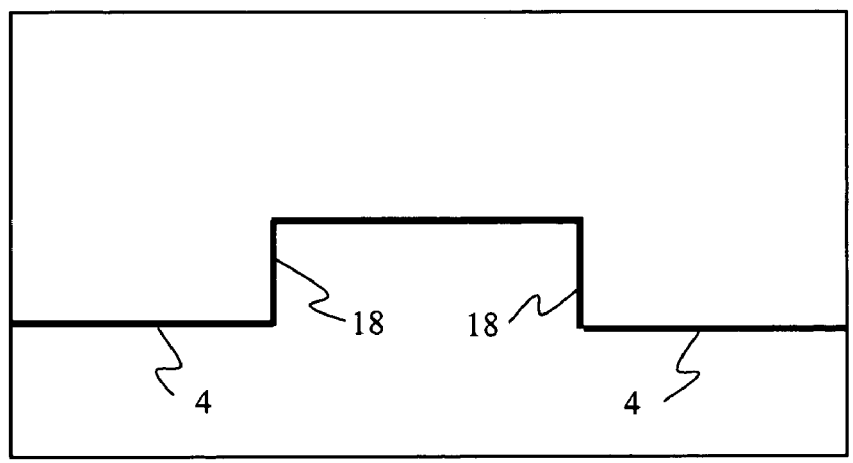
Figure 2E:
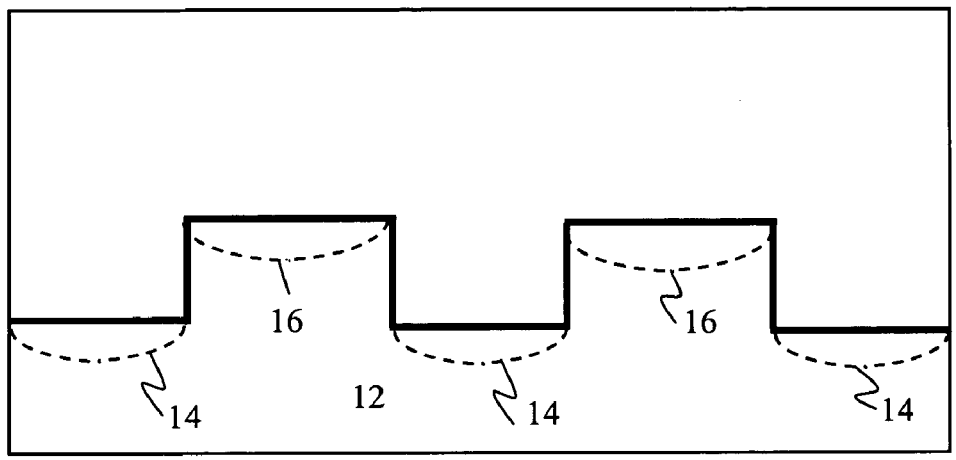

The structure shown in FIG. 2D is then subject to an ion implantation in which first regions 14 of N-conductivity type are formed in the bottom 4 of each of the trenches 6 and second regions 16 also of N-conductivity type are formed on the planar surface 8 of the substrate 12. The first regions 14 and second region 16 are spaced apart from one another by a channel region which runs along the length of the sidewall 18 of a trench 6. The resultant structure is shown in FIG. 2E. The ion implantation is done by using As species at 15 KEV and a dosage of $1\times10^{15}/cm^2$.

Figure 2F:
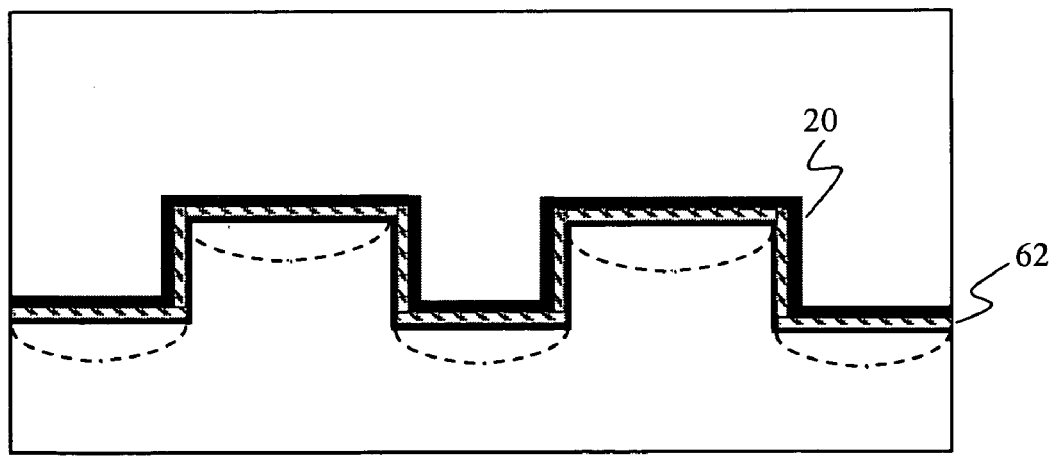

A layer of silicon dioxide 62 is then deposited on the structure shown in FIG. 2E. As a result, a layer of silicon dioxide of approximately 80 angstroms is deposited along the bottom 4, sidewall 18 of the trench, and along the planar surface 8 of the structure shown in FIG. 2E. Thereafter, doped polysilicon 20 is deposited on the layer of silicon dioxide 62. The polysilicon 20 is conformally deposited so that it covers the silicon dioxide 62. The resultant structure is shown in FIG. 2F.

The polysilicon layer 20 is then anisotropically etched. Because the polysilicon layer 20 is formed on the layer of silicon dioxide 62, it is spaced apart from the bottom 4 of the trench, and is spaced apart from the sidewall 18 of the trench 6. After the polysilicon layer 20 has been anisotropically etched, a floating gate 20 results in which the floating gate has two ends, a first end substantially near the bottom 4 of the trench 6 and a second away from the bottom 4 of the trench 6. At the second end is a tip 21 of the floating gate 20. Another layer of silicon dioxide 64 is then deposited conformally on the entire structure and covers the floating gate 20. The resultant structure is shown in FIG. 2G.

Figure 2G:
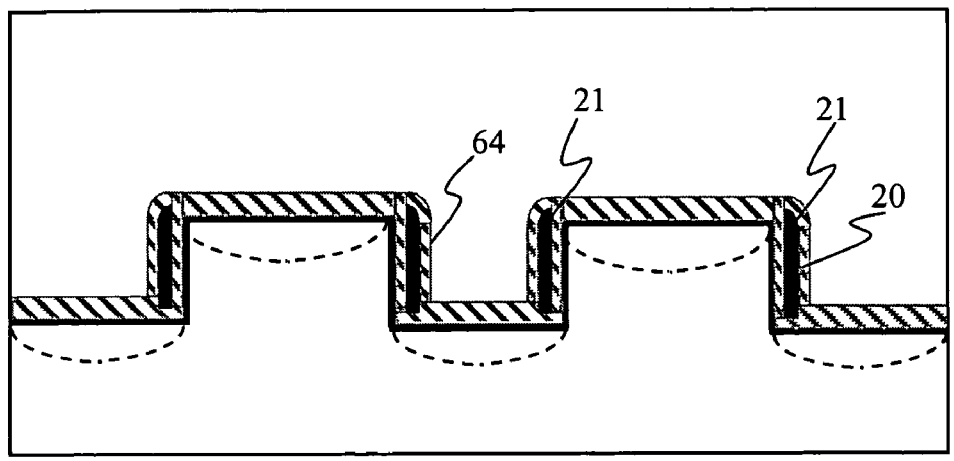

MOL (Middle-of-Line Oxide Layer) is then deposited everywhere including into the trench 6 of the structure shown in FIG. 2G. MOL is deposited on the silicon dioxide 64. The resultant structure is shown in FIG. 2H.

Figure 2H:
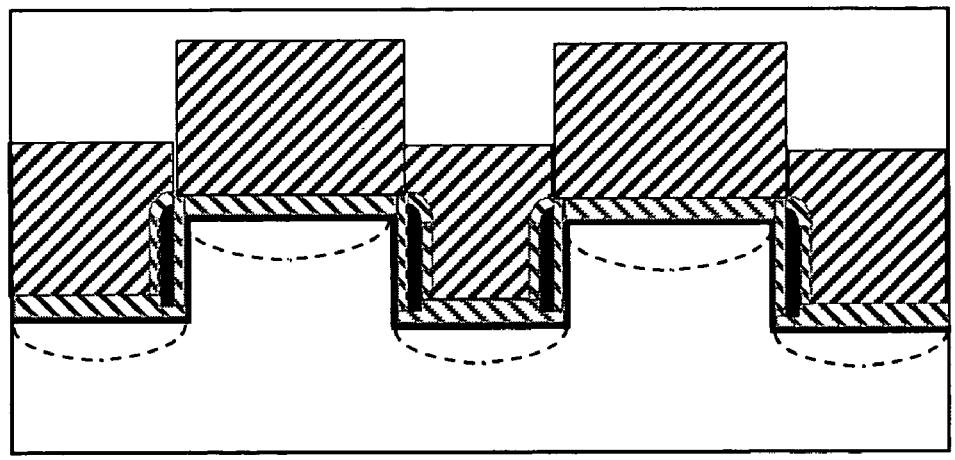

The structure shown in FIG. 2H is then subject to a CMP (chemical mechanical polishing) process. The stopping material for the CMP process is the silicon dioxide layer 64. The resultant structure is shown in FIG. 2I.

Figure 2I:
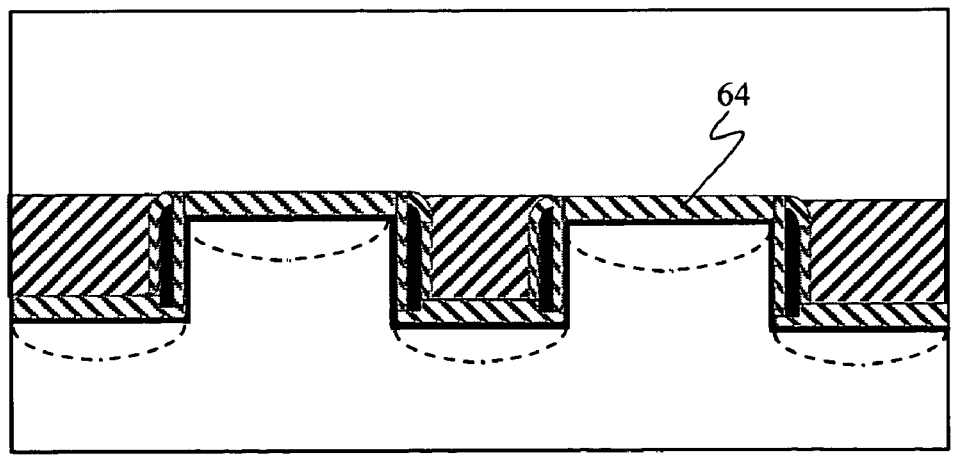

The structure shown in FIG. 2I is then subject to an anisotropic etch of the silicon dioxide layer 64 (which may also include portions of the silicon dioxide layer 62). The removal of the silicon dioxide layer 64 will proceed until the planar surface 8 of the substrate 12 is reached. The removal of the silicon dioxide 64 also removes the silicon dioxide that surrounds the tip 21 of the floating gate 20, thereby exposing the tip 21. The resultant structure is shown in FIG. 2J.

Figure 2J:
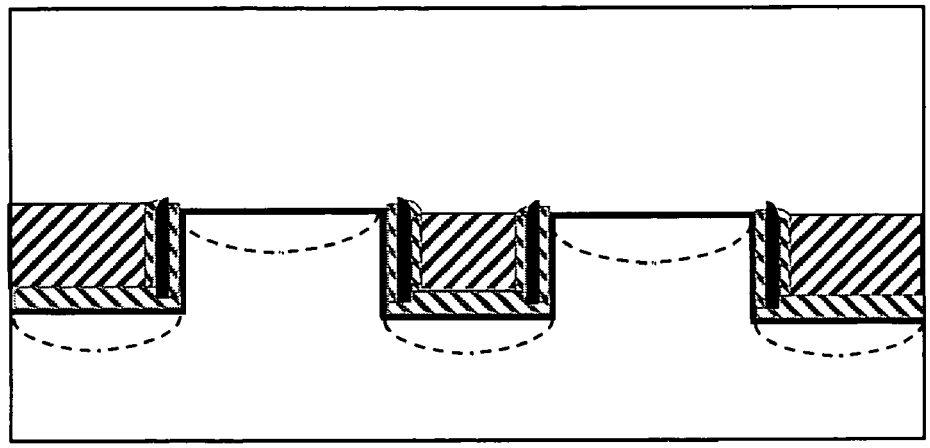
Figure 2K:
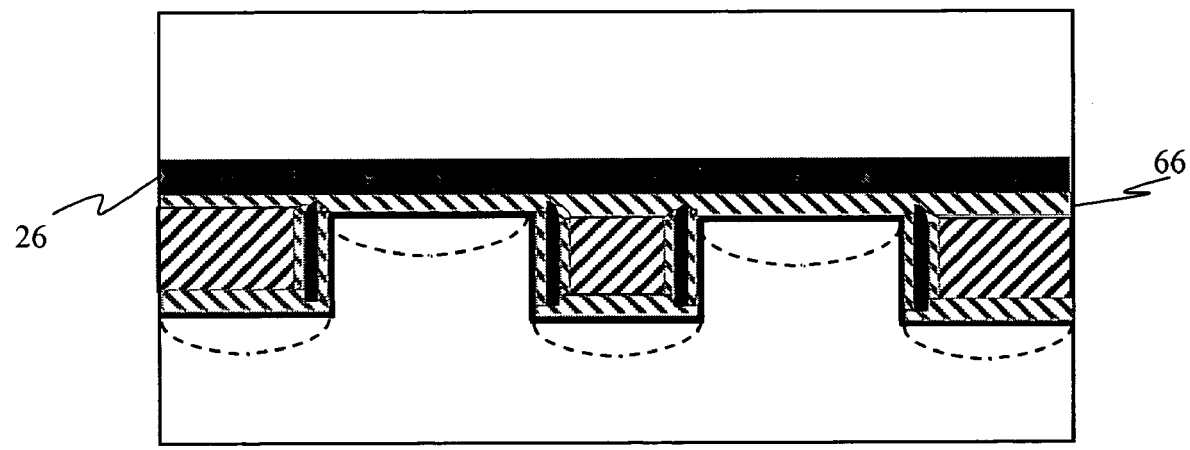

High temperature oxide (HTO) of silicon dioxide 66 is then deposited on the structure shown in FIG. 2J. The high temperature oxide layer 66 is deposited on the structure shown on FIG. 2J to form a tunnel oxide layer 66. A doped polysilicon layer 26 or metallized silicon or metal silicide layer 26 is then deposited on the HTO layer 66. The polysilicon layer 26 is patterned to define one row. The resultant structure is shown in FIG. 2K. The floating gates 20 are etched in a manner self-aligned to the control gates 26. This defines one floating gate at the intersection of the polysilicon 26 and the trench sidewall 18, and disrupts the trenches 6 in the column direction forming discontinuous trenches, separated by an isolation Additional insulating material is then deposited on the structure shown in FIG. 2K and first and second contacts 22 and 24, respectively, are then formed in certain select cells 10, through the insulating material 66 and through the control gate 26 to reach the first and second regions 14 and 16, respectively. The resultant structure is shown in FIG. 1A.

What is claimed is:

1. A non-volatile memory cell comprising:
   a substantially single crystalline substrate of a first conductivity type having a planar surface;
   a trench in said planar surface, said trench having a side wall and a bottom;
   a floating gate in said trench spaced apart and insulated from said sidewall and from said bottom; said floating gate having a tip away from said bottom;
   a first region of a second conductivity type in said bottom;
   a second region of a second conductivity type along said planar surface, spaced apart from said first region;
   a channel region between said first region and said second region, said channel region only along said sidewall, said floating gate spaced apart and along said entire channel region;
   a control gate, positioned above the planar surface, capacitively coupled to said floating gate and capable of effecting erase; and
   a tunnel material between said tip and said control gate, wherein said tunnel material is a tunnel oxide and configured to permit Fowler-Nordheim tunneling of charges from said floating gate to said control gate.

2. The memory cell of claim 1 further comprising an insulation material between said floating gate and said sidewall of said trench, said insulation material permitting injection of hot channel electrons from said channel region to said floating gate.

3. The memory cell of claim 1, further comprising:
   an assist gate in the trench, connected to the first region, and capacitively coupled to the floating gate.

4. The memory cell of claim 3 wherein the assist gate is substantially parallel to the floating gate and insulated therefrom.

5. An array of non-volatile memory cells in a substantially single crystalline substrate of a first conductivity type having a planar surface, said array comprising:
   a plurality of discontinuous trenches in said planar surface, spaced apart and substantially parallel to one another extending in a first direction; each of said discontinuous trenches having two sidewalls and a bottom and being discontinuous in said first direction by a plurality of isolations, each of said discontinuous trenches having a plurality of sections separated by an isolation;
   a first floating gate in each trench spaced apart and insulated from a first sidewall and from said bottom; said first floating gate having a tip away from said bottom;
   a second floating gate in each trench spaced apart and insulated from a second sidewall and from said bottom; said second floating gate having a tip away from said bottom;
   a first region of a second conductivity type in said bottom of each trench;
   a second region of said second conductivity type along said planar surface;
   a channel region between each of said first region and said second region, said channel region only along said first and second sidewall;
   a first contact in a first trench electrically connected to said first region of a first section and passing an adjacent isolation and electrically connected to said first region of a second section of said first trench, said first contact between a pair of floating gates and insulated therefrom;
   a plurality of control gates, each control gate extending in a second direction, substantially perpendicular to said first direction, extending over a plurality of tips of a plurality of floating gates and insulated therefrom; and
   a tunnel material between said plurality of tips and said control gate, wherein said tunnel material is a tunnel oxide and configured to permit Fowler-Nordheim tunneling of charges from said floating gate to said control gate.

6. The array of claim 5 further comprising an insulation material between said first floating gate and said first sidewall of said trench, said insulation material permitting injection of hot channel electrons from said channel region to said first floating gate.

7. The array of claim 6 further comprising said insulation material between said second floating gate and said second sidewall of said trench, said insulation material permitting injection of hot channel electrons from said channel region to said second floating gate.

8. A non-volatile memory device in a substantially single crystalline substrate of a first conductivity type having a planar surface, said device comprising:
   an array of non-volatile memory cells arranged in a plurality of rows and columns; wherein each cell comprising:
      a trench in said planar surface, said trench having a side wall and a bottom;
      a floating gate in said trench spaced apart and insulated from said sidewall and from said bottom; said floating gate having a tip away from said bottom;
      a first region of a second conductivity type in said bottom;
      a second region of a second conductivity type along said planar surface, spaced apart from said first region;
      a channel region between said first region and said second region, said channel region only along said sidewall;
      a control gate, above said substrate, spaced apart from said tip and capacitively coupled to said tip; and
      a tunnel material between said tip and said control gate, wherein said tunnel material is a tunnel oxide configured to permit Fowler-Nordheim tunneling of charges from said floating gate to said control gate; and
   wherein cells in adjacent columns share a common trench to one side and a common second region to another side;
   wherein cells in adjacent rows are separated by an isolation row and wherein said second region in one row is connected to said second region of another row;
   wherein a first cell in a first row includes a first contact in said trench electrically connected to said first region of said first cell and wherein said first contact is electrically connected to said first region of a second cell in a second row separated from said first row by at least one isolation row; and
   wherein said control gate of cells in the same row are connected together.

9. The device of claim 8 wherein a control gate extends over a plurality of rows.

10. The array of claim 9 further comprising an insulation material between said first floating gate and said first sidewall of said trench, said insulation material permitting injection of hot channel electrons from said channel region to said first floating gate.

11. The array of claim 10 further comprising said insulation material between said second floating gate and said second sidewall of said trench, said insulation material permitting injection of hot channel electrons from said channel region to said second floating gate.

12. A non-volatile memory device comprising:
   a plurality of non-volatile memory cells arranged in a plurality of rows and columns; each cell having a first terminal, in a trench, and a second terminal, not in a trench, with a channel region therebetween only along a sidewall of the trench, a floating gate spaced apart and insulated from said channel region along said sidewall of the trench, a control gate capacitively coupled with said floating gate, and a tunnel material between said floating gate and said control gate to configured to permit Fowler-Nordheim tunneling of charges from said floating gate to said control gate to effect erasure;
   a coupling gate, in the trench, capacitively coupled to the floating gate and electrically connected to said first terminal;
   wherein said cells in the same row are connected with each cell having a common second terminal with an adjacent cell to one side, and having a common first terminal and a common coupling gate with an adjacent cell to another side;
   wherein cells in the same row have the control gate connected together; and
   wherein cells in adjacent rows are separated by isolation.

13. The device of claim 12 wherein said floating gate of cells in the same row are capacitively coupled to the same control gate.

14. The device of claim 12 wherein cells in the same column have the same first terminal and the same second terminal.

* * * * *